(12) United States Patent
Ryding

(10) Patent No.: US 6,350,991 B1
(45) Date of Patent: Feb. 26, 2002

(54) ION IMPLANTER WITH VACUUM PISTON COUNTERBALANCE

(75) Inventor: Geoffrey Ryding, Manchester, MA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/293,956

(22) Filed: Apr. 19, 1999

(51) Int. Cl.$^7$ .................... H01J 37/20; H01J 37/317
(52) U.S. Cl. .................. 250/492.21; 250/442.11
(58) Field of Search .............. 250/492.21, 442.11, 250/441.11

(56) References Cited

U.S. PATENT DOCUMENTS

| | | | |
|---|---|---|---|
| 4,191,385 A | * 3/1980 | Fox .............................. 277/3 |
| 4,726,689 A | 2/1988 | Pollock ........................ 384/12 |
| 5,003,183 A | 3/1991 | Nogami et al. ........... 250/492.2 |
| 5,229,615 A | 7/1993 | Brune et al. .............. 250/492.2 |
| 5,898,179 A | * 4/1999 | Smick et al. ........... 250/492.21 |
| 6,172,372 B1 | * 1/2001 | Vanderpot .............. 250/492.21 |

FOREIGN PATENT DOCUMENTS

WO     WO 9913488     3/1999

* cited by examiner

*Primary Examiner*—Jack Berman
(74) *Attorney, Agent, or Firm*—Boult Wade Tennant

(57) ABSTRACT

An ion implanter comprises an ion beam generator to generate a beam of ions to be implanted which are directed into a process chamber. A scanning device is provided which is movable in linear reciprocating motion along a first axis relative to said process chamber. A wafer support structure having a longitudinal axis is mounted within the process chamber with the axis substantially horizontal. An end of the wafer support structure protrudes out of the process chamber through an aperture in its wall and is secured to the scanning device. At least one piston is attached to the end of the wafer support structure and is slidably received in at least one cylinder for reciprocating movement along a second axis parallel to the first axis. The cylinder has a first end which is open to allow atmospheric pressure to act on the piston, and the chamber within the cylinder enclosed by the piston is evacuated in use.

11 Claims, 4 Drawing Sheets

ION IMPLANTER WITH VACUUM PISTON COUNTERBALANCE

FIELD OF THE INVENTION

This invention relates to a counterbalance apparatus for use in an ion implanter.

BACKGROUND OF THE INVENTION

As will be familiar to those skilled in the art, in a typical ion implanter a relatively small cross-section beam of dopant ions is scanned relate to a silicon wafer. Traditionally, a batch of wafers was mechanically scanned in two directions relative to a fixed direction ion beam.

With the advent of larger wafers, up to 300 mm in diameter, processing of a single wafer at a time has advantages in terms of cost and reduced wastage etc. Accordingly, it is now desirable to scan an ion beam relative to a silicon wafer by mechanically scanning the wafer in a first direction and electrostatically or electromagnetically scanning or fanning the ion beam in a second direction.

There are a number of different configurations of single wafer processing machines. One example is described in WO99/13488 and other configurations are described in U.S. Pat. Nos. 5,003,183 and 5,229,615. In WO99/13488, the wafer is mounted upon a substrate holder in a process chamber of an implantation device. Attached to, or integral with, the substrate holder is an arm which extends through an aperture in the wall of the vacuum chamber. Mechanical scanning is effected by a scanning mechanism located outside the process chamber. The scanning mechanism is connected with the arm of the substrate holder and allows movement of the arm and hence the substrate holder relative to the process chamber.

Typically, the arm is substantially horizontal and is moved up and down in a reciprocating motion by a servo driven linear motor. Since the arm and substrate holder have significant combined mass, the effect of gravity on this mass makes it difficult for the servo and motor to provide precise velocity control throughout the upward and downward strokes.

It is an object of the present invention to address this problem and to provide a scanning system with a counterbalance device to achieve a substantially constant force system.

SUMMARY OF THE INVENTION

Accordingly, the present invention provides an ion implanter comprising: an ion beam generator to generate a beam of ions to be implanted; a process chamber into which the ion beam is directed, the process chamber having a wall defining an aperture; a scanning device movable in linear reciprocating motion along a first axis relative to said process chamber; a wafer support structure having a longitudinal axis and being mounted within said process chamber with said axis substantially horizontal, the wafer support structure having an end protruding out of said process chamber through said aperture and being secured to said scanning device; at least one piston attached to said end of said wafer support structure, said at least one piston having first and second opposed faces; at least one cylinder slidably receiving said at least one piston for reciprocating movement along a second axis parallel to said first axis, said at least one cylinder having a first end which is open to allow atmospheric pressure to act on said first face of said piston, and said at least one cylinder defining a chamber enclosed by said second face of said piston, said chamber, in use, being evacuated.

Preferably the ion implanter further comprises a rotor mounted on said wall of said process chamber for rotation relative to said process chamber, said rotor having an aperture through which said end of said wafer support surface passes; said scanning device and said at least one piston being mounted on said rotor for linear reciprocating movement relative thereto.

Preferably the first face of the piston has an area selected such that when the second axis is substantially vertical, atmospheric pressure acts upon the first face of the piston to create an upward force substantially equal to a downward force acting on the wafer support surface and the scanning means due to gravity.

Conveniently the rotor is rotatable relative to the process chamber, in use, on a fluid bearing layer. The scanning means may also be movable relative to the rotor, in use, on a fluid bearing layer. In either case the fluid of said fluid bearing layer may be compressed air.

The ion implanter preferably further comprises a linear motor for moving said scanning means. A servo control system may be provided for controlling the linear motor. Preferably, the motor is able to provide that the scanning means is reciprocatable relative to the process chamber at a velocity of about 40 cm/s and with a turnaround time of about 100 ms.

The chamber of the at least one cylinder is preferably evacuated, in use, to about 10 Torr.

BRIEF DESCRIPTION OF THE DRAWINGS

The invention may be put into practice in a number of ways, one embodiment of which will now be described by way of example only and with reference to the accompanying figures in which.

DESCRIPTION OF THE PREFERRED EMBODIMENT

Figure 1:
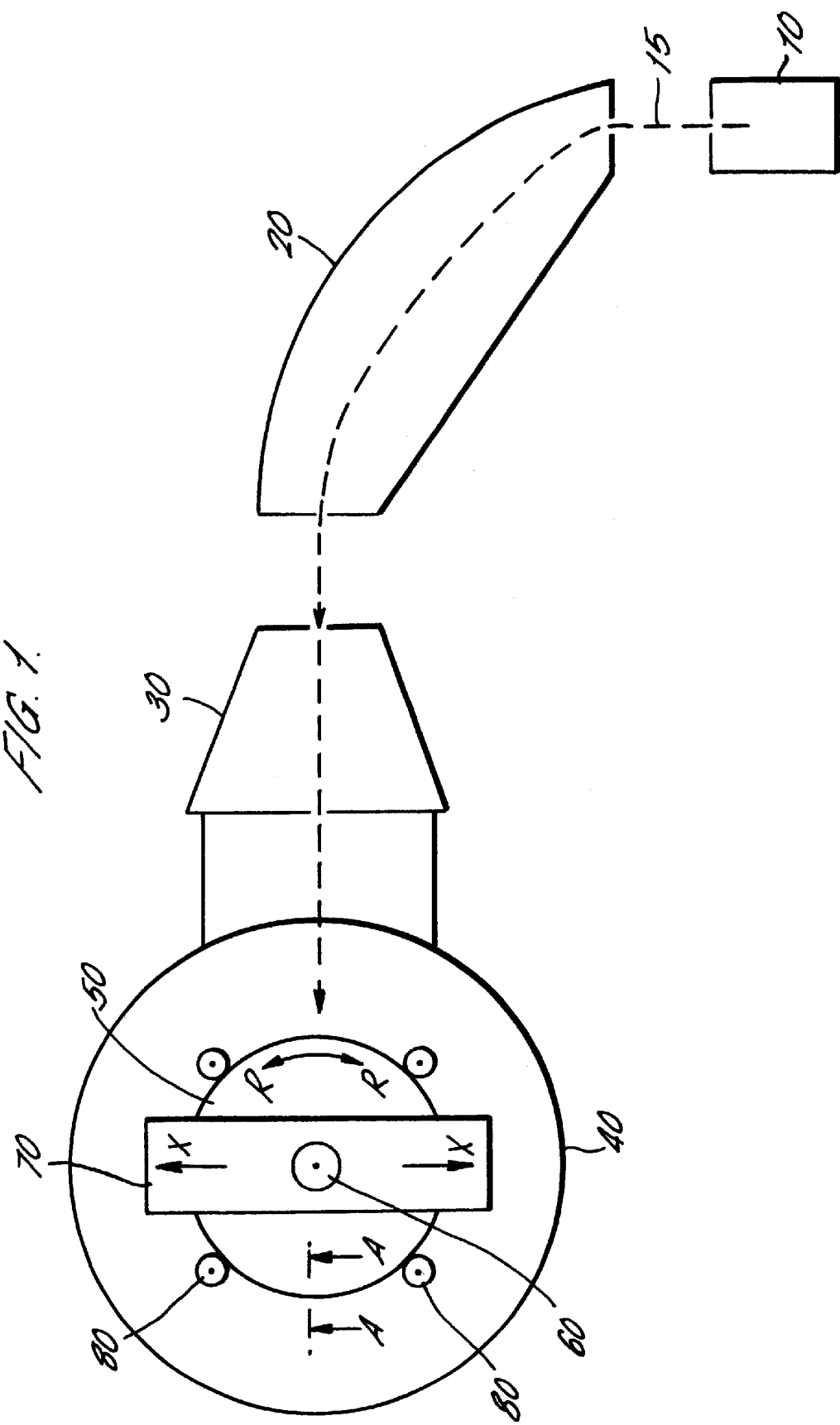
FIG. 1 shows a schematic side view of an ion implanter including a process chamber.

Referring first to FIG. 1, a schematic side view of an ion implanter is shown. The ion implanter includes an ion source 10 which is arranged to generate a (typically collimated) ion beam 15. The ion beam 15 is directed into a mass analyser 20 where ions of a desired mass/charge ratio are selected electromagnetically. Such techniques are well-known to those skilled in the art and will not be detailed further.

The ion beam 15 exits the mass analyser 20 in a generally collimated stream. The ion beam exiting the mass analyser may be subject to electrostatic acceleration or deceleration of the ions, depending upon the type of ions to be implanted and the desired implantation depth.

Downstream of the mass analyser is a process chamber 40 containing a wafer to be implanted. In the present embodiment, the wafer is typically a large single wafer, approximately 300 mm in diameter.

The ion beam which exits the mass analyser 20 generally has a beam width and height which is substantially smaller than the diameter of the wafer to be implanted. It is for this reason that the beam needs to be scanned relative to the wafer. In the preferred embodiment, the ion beam is scanned electrostatically or electromagnetically in the first plane via an electrostatic/electromagnetic scanner 30. In the present example, the ion beam is scanned in a single plane which extends into and out of the page when viewing FIG. 1. The wafer itself is scanned mechanically in a second direction orthogonal to the direction of scanning of the ion beam. To scan the wafer mechanically, the wafer is mounted upon a substrate support. This consists of a plate onto which the wafer is mounted within the process chamber 40, and an elongate arm connected to the plate.

The elongate arm extends out through the wall of the process chamber in a direction generally parallel with the scanning plane of the ion beam. The arm passes through a slot (not shown) in a rotor plate 50 which is mounted adjacent to a side wall of the process chamber 40. The end 60 of the scanning arm is mounted within a scanning member 70. To effect mechanical scanning of the scanning arm (and hence the wafer mounted upon the plate) relative to the electrostatically/electromagnetically scanned ion beam, the scanning member 70 is movable in a reciprocating manner in the direction X shown in FIG. 1. To facilitate this scanning, the undersurface of the scanning member 70 is spaced from the upper surface of the rotor plate 50 by a cushion of compressed air which acts as an air bearing.

The scanning member 70 in FIG. 1 is shown in a vertical position such that the surface of the wafer is perpendicular to the plane of the scanned or fanned instant ion beam. However, it may desirable to implant ions from the ion beam into the wafer at an angle. For this reason, the rotor plate 50 is rotatable about an axis defined through its centre, relative to the fixed wall of the process chamber 40. In other words, the rotor plate 50 is able to rotate in the direction R shown in FIG. 1.

As with the scanning member 70, movement of the rotor plate 50 relative to the wall of the process chamber is facilitated with an air bearing which lies between the lower surface of the rotor plate 50 and the upper surface of a stator (not shown in FIG. 1) mounted upon a flange extending from a wall of the process chamber 40. Radial movement of the rotor plate is constrained by a series of guide wheels 80 arranged around the circumference of the rotor plate 50. Unwanted axial movement of the rotor plate is prevented in use by the pressure differential between the two faces of the rotor plate. In particular, the inside of the process chamber is evacuated to prevent contamination of the wafer and ion beam and a large force due to atmospheric pressure accordingly acts to hold the rotor plate against the stator.

When the rotor plate 50 is rotated, the scanning means 70 is rotated with it so that the arm will then be reciprocated in a plane at an angle to the vertical.

This arrangement is advantageous because the point at which the ion beam impinges on the wafer will always lie in the same vertical plane at a fixed position in the process chamber 40 and thus, uniform ion implantation is achieved. This is in contrast to systems in which the wafer is mounted on the top of an arm having a vertical longitudinal axis and which is only reciprocatable in a vertical plane. In this type of system, if the wafer carried by the arm is positioned at an angle to the vertical then the vertical plane containing the point at which the ion beam impinges on the wafer continuously varies its position within the chamber as the arm reciprocates. This is disadvantageous because the ion concentration of the beam is not uniform along its length and thus non-uniform implantation results.

The mechanical scanning arrangement described above is that described in the aforementioned WO99/13488, assigned to a common assignee, the contents of which are hereby incorporated in their entirety by reference.

Figure 2:
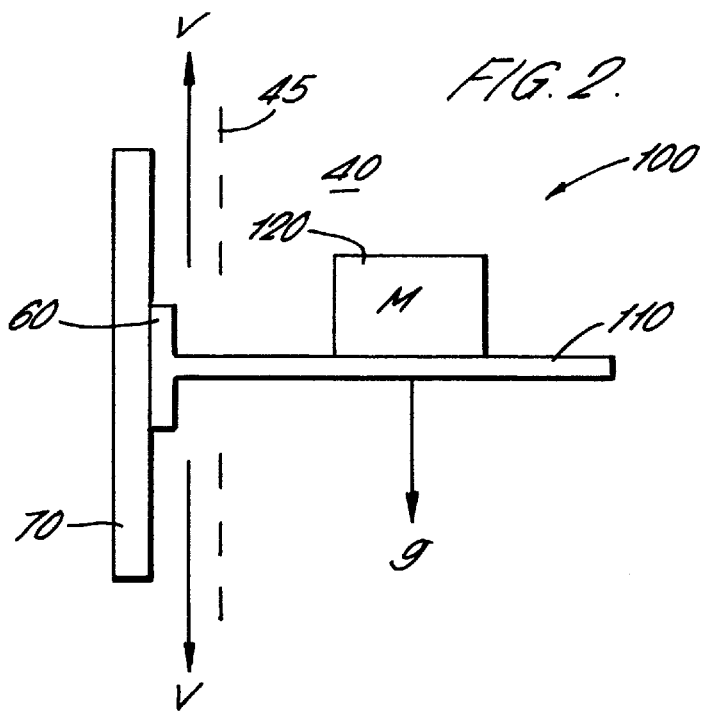
FIG. 2 shows a schematic diagram of the scanning system associated with the ion implanter of FIG. 1.

FIG. 2 shows in schematic form a conventional scanning mechanism 100 as viewed in the direction of arrow A in FIG. 1. The scanning mechanism 100 consists of an elongate arm 110 mounted with its longitudinal axis substantially horizontal in the process chamber 40 and carrying a substrate support 120 to which a wafer is attached for implantation.

The end 60 of the arm 110 distal from the substrate support 120 extends out of the process chamber 40 through an aperture in the wall 45 which is illustrated by the dotted line. The end 60 of the arm 110 is attached to the scanning mechanism 70 which includes a linear motor (not shown) operable to raise and lower the arm 110 and the substrate support 120 in reciprocating vertical motion as indicated by the arrows X with velocity control being as precise as possible. The linear motor is controlled by a servo system (not shown) having position feedback.

The velocity of reciprocating movement is preferably in the order of 40 cm/s with a desired 0.1% accuracy and the desired turnaround time between the upward and downward strokes is in the order of less than 100 ms.

However, the combined mass M of the arm 60 and substrate support 120 is significant, typically in the order of 250 lbs and therefore the effect of gravity g on the mass M is also significant. The requirements of the motor and servo system are complicated by the gravitational pull on the mass M since it is necessary to compensate for its opposing effects in the upward and downward strokes to ensure constant velocity movement. Thus, the motor and servo system must be capable of providing a constant upward force to compensate for the downward gravitational pull. Substantially different servo requirements will also ensue at the turnaround between the upward the downward strokes. A further concern is that in the event of power failure to the motor and servo system, the arm 110 and substrate support 120 will fall under the influence of gravity with an acceleration of g.

Figure 3:
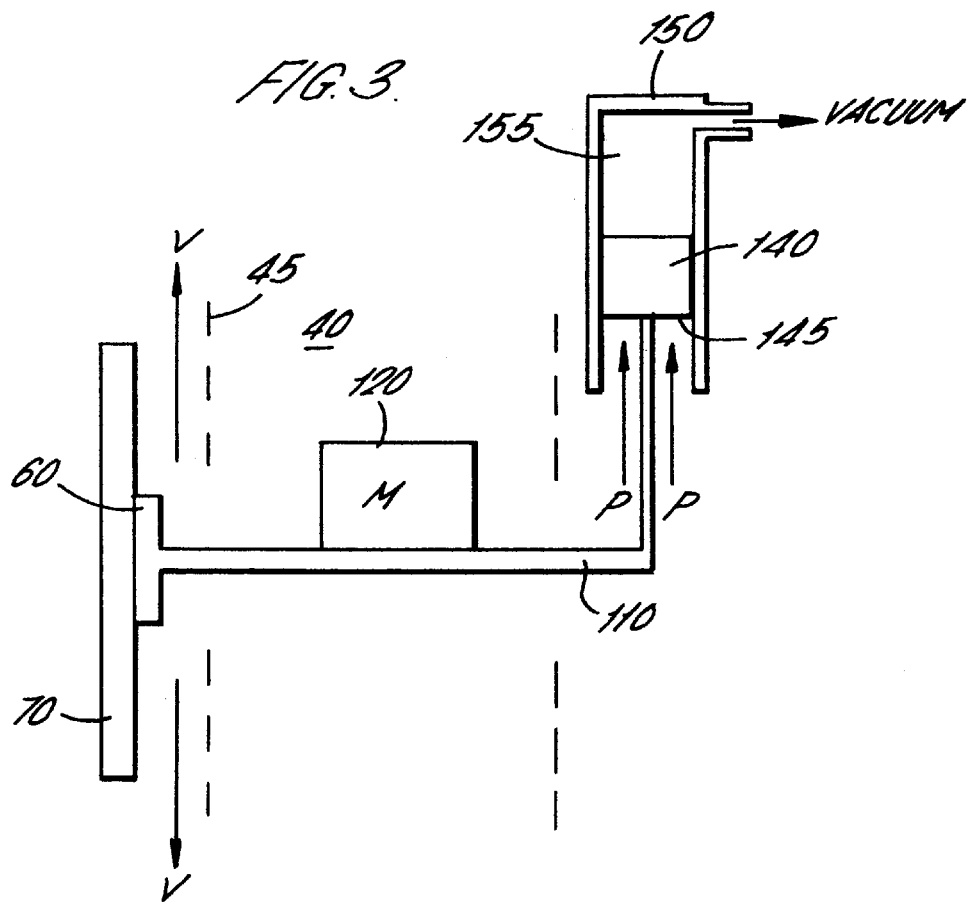
FIG. 3 shows a schematic diagram illustrating the principles of a scanning system according to the present invention.

FIG. 3 shows in schematic form a modified scanning system illustrating the principles of the present invention. The same reference numbers have been used for features which are common to both FIGS. 2 and 3.

In FIG. 3, the arm 110 is attached to a piston 140 located outside the process chamber 40 and slidably received for reciprocating movement in a cylinder 150. The longitudinal axis of the cylinder 150 and piston 140 is parallel with the direction X of reciprocal movement of the arm 110 and scanning means 70.

The lower end of the cylinder 150 is open so that the lower surface 145 of the piston 140 is subject to atmospheric pressure indicated by arrows P. The chamber 155 defined by the cylinder 150 and enclosed by the piston 140 is evacuated. For this purpose, it is not necessary to achieve a particularly high vacuum and a simple vacuum pump (not shown) capable of producing pressures below about 10 Torr is sufficient. However, it is desirable that the change in pressure in the chamber 155 as the piston 140 moves through its complete stroke should be minimal. The throughput of the pump will of course depend upon the leakage rate past the piston 140 into the evacuated chamber 155.

The diameter of the piston 140 and hence the cross sectional area of its lower face 145 is selected so that when the cylinder 150 and piston 140 are vertically oriented the upward force acting on the piston 140 as a result of atmospheric pressure reduces or, preferably, substantially equals the downward gravitational force on the combined mass of the arm 110, substrate support 120 and the piston 140. Accordingly, the piston 140 and cylinder 150 assembly provides a counterbalance to reduce or nullify the resultant force acting on the movable stage. As a result, it is no longer necessary for the servo and motor to provide an offset force to counterbalance the gravitational pull and consequently the demands on the motor and servo system are significantly simplified. In particular, the requirements are limited strictly to overcoming inertial effects results from changes in direction at the turnaround between the upward and downward strokes. The problems associated with power failure are also reduced or eliminated.

A further advantage of using a vacuum cylinder is that as the piston moves up and down the only flow of air is in and out of the open end of the cylinder and no valving system is necessary as it would be if an air cylinder or gas spring was used. A vacuum cylinder also does not suffer from the "spongyness" often found with air cylinders.

Although in the schematic diagram of FIG. 3 the piston 140 is shown attached to the arm 110 at a location remote from the end 60 which is attached to the scanning means 70, in practice it is preferred to attach the piston 140 at the end 60 adjacent to the scanning means 70. This avoids the need for both ends of the arm 110 to protrude out of the process chamber 40 and reduces any torque on the arm 110.

Figure 4:
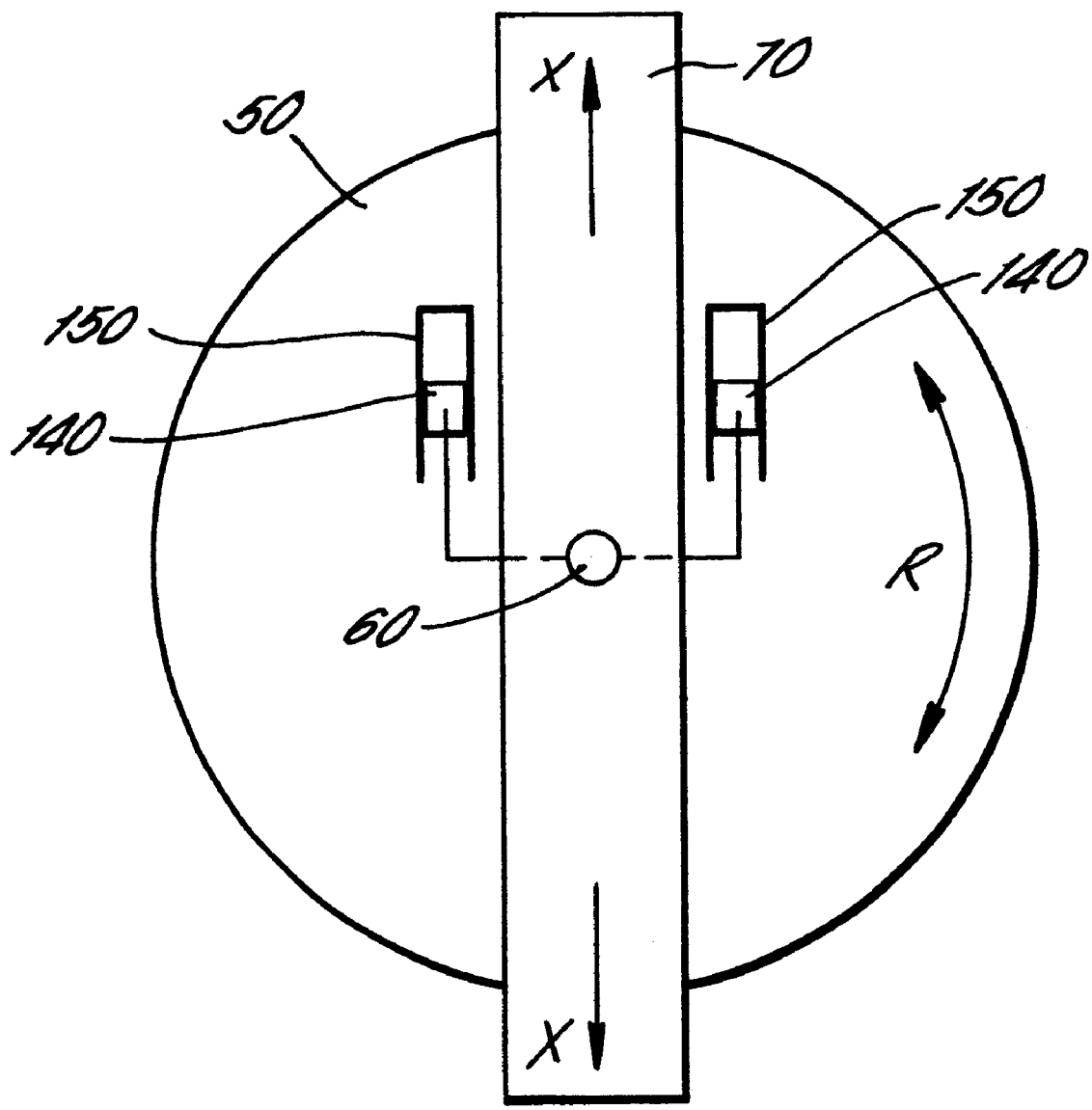
FIG. 4 is a schematic side view of an ion implanter process chamber including apparatus in accordance with one embodiment of the present invention.

FIG. 4 illustrates in schematic form a preferred embodiment of the present invention. As shown, a pair of pistons 140 are attached on either side of the end 60 of the arm 110 adjacent the scanning means 70. The scanning means 70 together with the pistons 140 and the cylinders 150 are mounted on the rotor 50 which, as described above, is rotatable relative to the process chamber 140 in the direction of arrows R. Thus, if the rotor 50 is rotated say, anti-clockwise by 10 degrees, the scanning means 70, pistons 140 and cylinders 150 are also rotated so as to lie at 10 degrees to the vertical and the reciprocating motion of the arm 110 and pistons 140 will occur in a plane at 10 degrees to the vertical. In this angled position, the vertical component of the force acting on the pistons 140 as a result of atmospheric pressure may not exactly counterbalance the forces acting on the arm 110 and support substrate 120 due to gravity but the differences are relatively minor and can be accommodated by the linear motor and servo control system.

Figure 5:
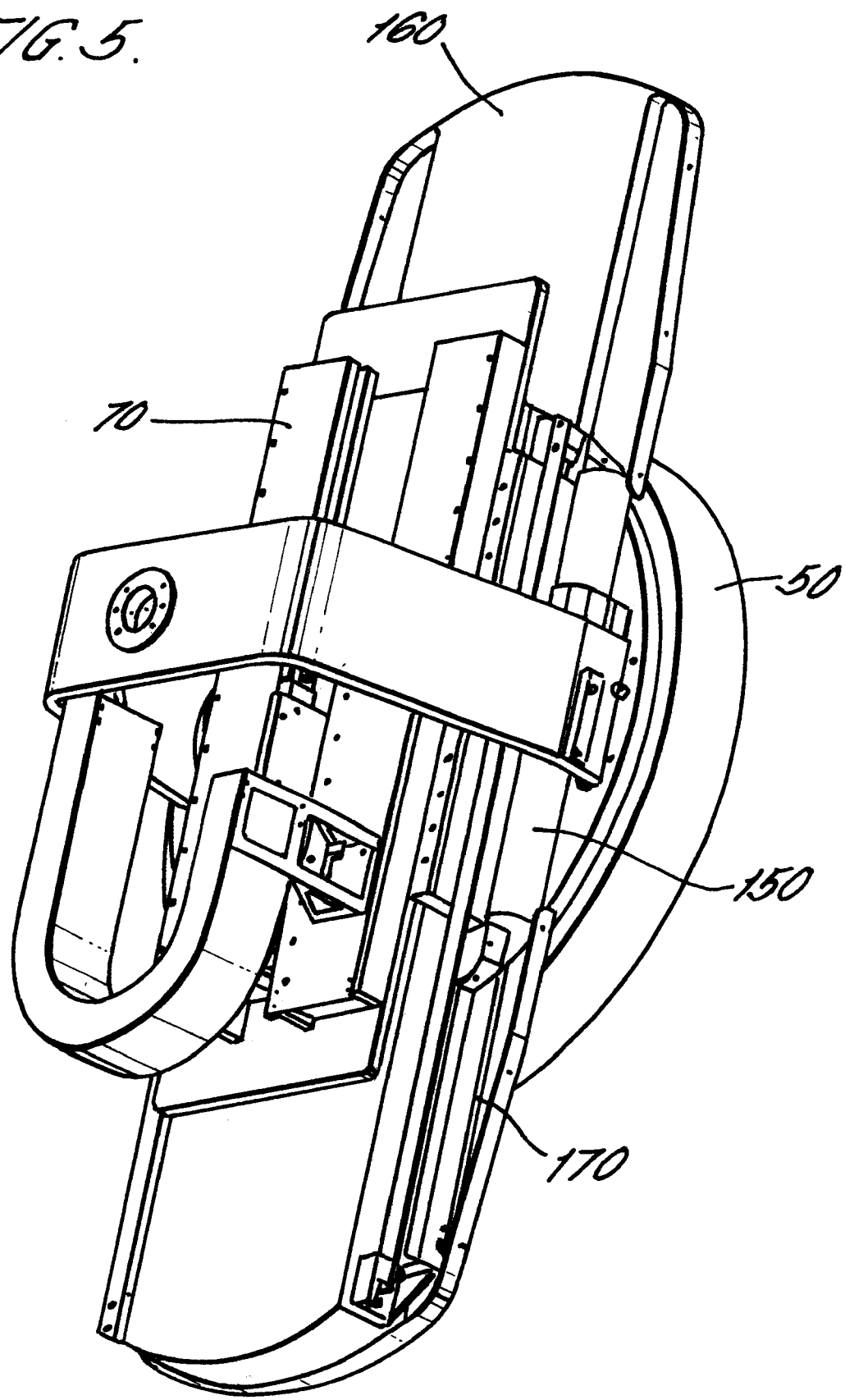
FIG. 5 is a side perspective view of an actual apparatus incorporating the present invention.

FIG. 5 shows in perspective view from one side an actual apparatus incorporating the present invention. The scanning means 70 is reciprocatable along a guide track 160 mounted on the rotor 50. The cylinders 150, only one of which is visible in FIG. 5, are attached to the guide track 160. A connecting rod 170 attaches each piston (not visible in FIG. 5) to the lower end of the scanning means 70. As the scanning means 70 moves up and down the guide track 160, thereby also moving the arm 110, which is attached to it but not visible in FIG. 5, the connecting rods 170 drive the pistons 140 up and down in the cylinders 150.

Whilst the invention has been described in connection with an ion implanter having a support substrate which is mounted on a horizontal arm and is movable vertically, it will be appreciated that the invention may be employed in other situations in which it is desirable to counterbalance the effect of gravity on a relatively massive structure which must be moved in a precise and controlled manner.

Although the present invention has been described with reference to a preferred embodiment, those skilled in the art will recognise that changes may be made in form and detail without departing from the spirit and scope of the invention, which is to be determined in accordance with the appended claims.

What is claimed is:

1. An ion implanter comprising:
   an ion beam generator to generate a beam of ions to be implanted;
   a process chamber into which the ion beam is directed, the process chamber having a wall defining an aperture;
   a scanning device movable in linear reciprocating motion relative to said process chamber;
   a reaction support point which is fixed relative to said reciprocating motion of said scanning device;
   a wafer support structure having a longitudinal axis and being mounted within said process chamber with said axis substantially horizontal, the wafer support structure having an end protruding out of said process chamber through said aperture and being secured to said scanning device;
   at least one piston and cylinder combination comprising a piston having first and second opposed faces and a cylinder slidably receiving said piston;
   said combination connecting between said scanning device and said reaction support point so as to be operatively aligned with said linear reciprocating motion of said scanning device;
   said cylinder having a first end which is open to allow atmospheric pressure to act on said first face of said piston, and said cylinder defining a chamber enclosed by said second face of said piston;
   and a vacuum pump connected to said enclosed chamber and operable to maintain a vacuum in said enclosed chamber, so that said piston and cylinder combination provides a substantially constant counter-balance force on said scanning device over said reciprocating motion.

2. An ion implanter as claimed in claim 1, further comprising a rotor mounted on said wall of said process chamber for rotation relative to said process chamber, said rotor having an aperture through which said end of said wafer support surface passes, said scanning device and said at least one piston and cylinder combination being mounted on said rotor for linear reciprocating movement relative thereto.

3. An ion implanter as claimed in claim 1, wherein said first face of said piston has an area selected such that when said linear reciprocating motion is substantially vertical, atmospheric pressure acts upon said first face of said piston to create an upward force substantially equal to a downward force acting on said wafer support surface and said scanning device due to gravity.

4. An ion implanter as claimed in claim 2, wherein said rotor is rotatable relative to said process chamber, in use, on a fluid bearing layer.

5. An ion implanter as claimed in claim 4, wherein the fluid of said fluid bearing layer is compressed air.

6. An ion implanter as claimed in claim 2, wherein said scanning means is movable relative to said rotor, in use, on a fluid bearing layer.

7. An ion implanter as claimed in claim 6, wherein said fluid of said fluid bearing layer is compressed air.

8. An ion implanter as claimed in claim 1, further comprising a linear motor for moving said scanning means.

9. An ion implanter as claimed in claim 8, further comprising a servo control system for controlling said linear motor.

10. An ion implanter as claimed in claim 1, wherein said scanning means is reciprocatable relative to said process chamber at a velocity of about 40 cm/s and with a turn-around time of about 100 ms.

11. An ion implanter comprising:

an ion beam generator to generate a beam of ions to be implanted;

a process chamber into which the ion beam is directed, the process chamber having a wall defining an aperture;

a scanning device movable in linear reciprocating motion along a first axis relative to said process chamber;

a wafer support structure having a longitudinal axis and being mounted within said process chamber with said axis substantially horizontal, the wafer support structure having an end protruding out of said process chamber through said aperture and being secured to said scanning device;

at least one piston attached to said end of said wafer support structure, said at least one piston having first and second opposed faces;

at least one cylinder slidably receiving said at least one piston for reciprocating movement along a second axis parallel to said first axis, said at least one cylinder having a first end which is open to allow atmospheric pressure to act on said first face of said piston, and said at least one cylinder defining a chamber enclosed by said second face of said piston, and a vacuum pump connected to said enclosed chamber and operable to maintain a vacuum in said enclosed chamber so that said piston provides a substantially constant counter-balance force on said scanning device over said reciprocating motion.

* * * * *